United States Patent [19]
Sakamoto

[11] Patent Number: 5,381,358
[45] Date of Patent: Jan. 10, 1995

[54] CYCLIC DIGITAL FILTER

[75] Inventor: Etsurou Sakamoto, Kanagawa, Japan

[73] Assignee: Sony Corporation, Tokyo, Japan

[21] Appl. No.: 110,627

[22] Filed: Aug. 23, 1993

Related U.S. Application Data

[63] Continuation of Ser. No. 861,033, Mar. 31, 1992, abandoned.

[30] Foreign Application Priority Data

Apr. 12, 1991 [JP] Japan .................... 3-108736
Oct. 24, 1991 [JP] Japan .................... 3-305478

[51] Int. Cl.⁶ .............................................. G06F 15/31
[52] U.S. Cl. ............................................. 364/724.17
[58] Field of Search ................................ 364/724.17

[56] References Cited

U.S. PATENT DOCUMENTS

| | | | |
|---|---|---|---|
| 4,751,663 | 6/1988 | Yamazaki | 364/724.17 |
| 4,811,263 | 3/1989 | Hedley et al. | 364/724.17 |
| 4,920,507 | 4/1990 | Takeda | 364/724.17 |
| 4,972,356 | 11/1990 | Williams | 364/724.17 |
| 5,089,981 | 2/1992 | Cabot | 364/724.17 |

OTHER PUBLICATIONS

Signal Processing IV: Theories and Applications vol. 2, 5 Sep. 1988, Grenoble, FR pp. 755-758, XP 124742

KWAN et al. 'efficient high speed delayed multipath one-dimensional recursive digital filter architecture'. Electronics Letters vol. 25, No. 15, 20 Jul. 1989, Enage GB pp. 982-983, XP72014 Kaneko 'alternative implementation of systolic recursive digital filters'.

*Primary Examiner*—David H. Malzahn
*Attorney, Agent, or Firm*—William S. Frommer; Alvin Sinderbrand

[57] ABSTRACT

Disclosed is a cyclic digital filter comprising a feedback loop including a first unit time delay circuit for delaying an input signal by a unit time; a coefficient multiplier for multiplying by a predetermined coefficient the output from the first unit time delay circuit; and an adder for adding the input signal and the result of the multiplication by the coefficient multiplier. The adder performs add and subtract operations involving the input signal and the output signal supplied via the first unit time delay circuit and via the coefficient multiplier. The cyclic digital filter also comprises a second unit time delay circuit interposingly provided between the coefficient multiplier and the adder. In operation, the coefficient of the coefficient multiplier is adjusted to maintain, in the presence of the second unit time delay circuit, the characteristics of the cyclic digital filter in effect when the second unit time delay circuit is absent.

5 Claims, 9 Drawing Sheets

CYCLIC DIGITAL FILTER

This application is a continuation of application Ser. No. 07/861,033, filed Mar. 31, 1992, now abandoned.

BACKGROUND OF THE INVENTION

1. Field of the Invention

The present invention relates to a digital filtering circuit (filter) and, more particularly, to a cyclic (or recursive) digital filter suitable for high-speed signal processing.

2. Description of the Prior Art

The general transfer function H(z) for cyclic digital filters is expressed by Equation (1):

$$H(z) = \frac{\sum_{\mu=0}^{M} a_\mu \cdot z^{-\mu}}{1 + \sum_{\nu=1}^{N} b_\nu \cdot z^{-\nu}} \tag{1}$$

where, N is greater than M. Suitably developing the transfer function H(z) allows various types of cyclic digital filter to be constructed. The cyclic digital filters generally fall into three types: direct cyclic digital filter, parallel cyclic digital filter, and cascade cyclic digital filter.

FIGS. 8 and 9 show the theoretical structures of topical direct cyclic digital filters. FIG. 8 illustrates a direct cyclic digital filter in effect when N is greater than M. For this filter, the transfer function H(z) addressing an output signal $y_n$ with respect to an input signal $x_n$ is duly expressed by Equation (1).

In FIG. 8, an encircled plus (+) sign stands for an adder that performs add or add-subtract operations, a triangle for a coefficient multiplier that multiplies an input signal by a coefficient, and a rectangle for a unit time delay circuit that provides a unit-time delay. The symbol $x_n$ represents an input signal, and the symbol $Y_n$, an output signal. The unit delay time of the unit time delay circuit generally corresponds to one clock pulse.

FIG. 9 depicts the theoretical structure of a direct cyclic digital filter i.e. effect when N is equal to M. The transfer function H(z) in effect at this time is also expressed by Equation (1).

In FIG. 9, as in FIG. 8, an encircled plus (+) sign stands for an adder, a triangle for a coefficient multiplier, and a rectangle for a unit time delay circuit. The symbol $x_n$ represents an input signal, and the symbol an output signal.

FIG. 10 shows the theoretical structure of a typical parallel cyclic digital filter. In FIG. 10, as in FIG. an encircled plus (+) sign stands for an adder, a triangle for a coefficient multiplier, and a rectangle for a unit time delay circuit. The symbol $x_n$ represents an input signal, and the symbol $Y_n$, an output signal. If N equals M, the transfer function H(z) for this filter is expressed by Equation (2):

$$H(z) = \sum_{k=1}^{K} H_k(z) \tag{2}$$
$$= a_0 + \sum_{k=1}^{K_1} \frac{a_{0k}^{(1)}}{1 + b_{1k}^{(1)} z^{-1}} + \sum_{k=1}^{K_1} \frac{a_{0k}^{(2)} + a_{1k}^{(2)} z^{-1}}{1 + b_{1k}^{(2)} z^{-1} + b_{2k} z^{-2}}$$

FIG. 11 illustrates the theoretical structure of a typical cascade cyclic digital filter. In FIG. 11, as in FIG. 8, an encircled plus (+) sign stands for an adder, a triangle for a coefficient multiplier, and a rectangle for a unit time delay circuit. The symbol $x_n$ represents an input signal, and the symbol $Y_n$, an output signal. The transfer function for this filter is expressed by Equation (3):

$$H(z) = \prod_{k=1}^{K} H_k(z) \tag{3}$$
$$= a_0 \prod_{k=1}^{k_1} \frac{1 + a_{1k}^{(1)} z^{-1}}{1 + b_{1k}^{(1)} z^{-1}} \prod_{k=1}^{K_2} \frac{1 + a_{1k}^{(2)} z^{-1} + a_{2k}^{(2)} z^{-2}}{1 + b_{1k}^{(2)} z^{-1} + b_{2k}^{(2)} z^{-2}}$$

For the direct cyclic digital filter whose theoretical structure is shown in FIG. 8, assume that T1 stands for the time required to multiply the filter coefficient, and T2 for the time required For two-input, one-output addition and subtraction. In that case, the practical circuit for high-speed operation may be constructed as shown in FIG. 12.

The cyclic digital filter of FIG. 12 is a direct cyclic digital filter comprising a feed-forward circuit 300 and a feedback loop circuit 320 connected in series.

The feed-forward circuit 300 contains a first feed-forward circuit, a second feed-forward circuit, a third feed-forward circuit, ..., an M-th feed-forward circuit, and an (M+1)th feed-forward circuit. The first feed-forward circuit comprises a coefficient multiplier 301 that multiplies the input signal $x_n$ by a filter coefficient $a_0$; a unit time delay circuit 302 that delays the result of the multiplication by one clock pulse; and an adder 303 that adds the delayed output from the unit time delay circuit 302 and the delayed output from a lower-stage unit time delay circuit 307 (to be described later). The second feed-forward circuit comprises a coefficient multiplier 304 that multiplies the input signal $x_n$ by a filter coefficient $a_1$; a unit time delay circuit 305 that delays the result of the multiplication by one clock pulse; and an adder 30 that adds the delayed output from the unit time delay circuit 305 and the delayed output from a lower-stage unit time delay circuit 311 (to be described later). The third feed-forward circuit comprises a coefficient multiplier 308 that multiplies the input signal $x_n$ by a filter coefficient $a_2$; a unit time delay circuit 309 that delays the result of the multiplication by one clock pulse; and the adder 310 that adds the delayed output from the unit time delay circuit 309 and the delayed output from a lower-stage unit time delay circuit, not shown. The M-th feed-forward circuit includes a coefficient multiplier 312 that multiplies the input signal $x_n$ by a filter coefficient $a_{M-1}$; a unit time delay circuit 313 that delays the result of the multiplication by one clock pulse; and an adder 314 that adds the delayed output from the unit time delay circuit 313 and the delayed output from a lower-stage unit time delay circuit 318 (to be described later). The (M+1)th feed-forward circuit contains a coefficient multiplier 316 that multiplies the input signal $x_n$ by a filter coefficient $a_M$; a unit time delay circuit 317 that delays the result of the multiplication by one clock pulse; and the unit time delay circuit 318 that delays by one clock pulse the delayed output from the unit time delay circuit 317.

In their feed-forward operations, the first through the (M+1)th feed-forward circuits carry out in parallel the multiplications of the input signal $x_n$ by their respective coefficients and the delaying of the result of such multiplications.

In the feed-forward circuit 300, the unit time delay circuit 307 is located on the output side of the adder 306; the unit time delay circuit 311, on the output side of the adder 310; ..., and a unit time delay circuit 315, on the output side of the adder 314. The delayed outputs from these unit time delay circuits are supplied, in cascade fashion, to the adders 303, 306, ..., 314 respectively located lower-stage. This circuit arrangement is intended to prevent individual multiplication time periods, unit delay time periods and addition time periods from getting accumulated.

The feedback loop circuit 320 comprises a unit time delay circuit 321, an adder 322 and another unit time delay circuit 323. The unit time delay circuit 321 latches and delays for a unit time the output coming from the adder 303 in the feed-forward circuit 300. The adder 322 subtracts the result of the addition by an adder 325, to be discussed later, from the delayed output of the unit time delay circuit 321, the result of the subtraction being output as the output signal $y_n$. The unit time delay circuit 323 latches and delays for a unit time the output from the adder 322.

The feedback loop circuit 320 further comprises a first feedback loop circuit, a second feedback loop circuit, a third feedback loop circuit, ..., an N-th feedback loop circuit, and an (N+1)th feedback loop circuit. The first feedback loop circuit contains a coefficient multiplier 324 that multiplies the delayed output from the unit time delay circuit 323 by a coefficient $b_1$; an adder 325 that adds the output from the multiplier 324 and the delayed output from a lower-stage unit time delay circuit 328 (to be described later). The second feedback loop circuit has the coefficient multiplier 326 that multiplies the delayed output from the unit time delay circuit 323 by a coefficient $b_2$; and an adder 327 that adds the output from the multiplier 326 and the delayed output from a lower-stage unit time delay circuit 331 (to be described later). The third feedback loop circuit includes a coefficient multiplier 329 that multiplies the delayed output from the unit time delay circuit 323 by a coefficient $b_3$; and an adder 330 that adds the output from the multiplier 329 and the delayed output from a lower-stage unit time delay circuit, not shown. The N-th feedback loop circuit comprises a coefficient multiplier 332 that multiplies the delayed output from the unit time delay circuit 323 by a coefficient $b_{N-1}$; and an adder 333 that adds the output from the multiplier and the delayed output from a lower-stage unit time delay circuit 336. The (N+1)th feedback loop circuit has a coefficient multiplier 335 that multiplies the delayed output from the unit time delay circuit 323 by a coefficient $b_N$; and a unit time delay circuit 336 that delays the output from the multiplier 332 by a unit time.

In addition, the feedback loop circuit 320 has a unit time delay circuit 328 located on the output side of the adder 327, the circuit 328 latching and delaying for a unit time the result of the addition by the adder 327, the delayed output being sent to the adder 325. A unit time delay circuit 331 is located on the output side of the lower-stage adder 330. The delayed output from the unit time delay circuit 331 is fed to the upstream adder 327. Likewise, the output from the unit time delay circuit 336 is supplied to the adder 333.

FIG. 13 illustrates the construction of a simplified version of the direct cyclic digital filter in FIG. 12, the filter of FIG. 13 being constructed by assuming that M=N=1.

The digital filter of FIG. 13 comprises a unit time delay circuit 341 that delays the input signal $x_n$ by a unit time; an adder 342 that subtracts from the delayed output of the unit time delay circuit 341 the result of the multiplication performed by a coefficient multiplier 346 (to be described later); a unit time delay circuit 340 that delays for a unit time the result of the addition by the adder 342; the coefficient multiplier 346 that multiplies the delayed output from the unit time delay circuit 340 by the coefficient $b_1$; a coefficient multiplier 348 that multiplies by the coefficient $a_0$ the result of the addition by the adder 342; an adder 343 that adds the result of the multiplication by the coefficient multiplier 348 and the result of the multiplication by a coefficient multiplier 349 (to be described later); a coefficient multiplier 349 that multiplies the delayed output from the unit time delay circuit 345 by the coefficient a and a unit time delay circuit 347 that delays for a unit time the result of the addition by the adder 343, the delayed output being output as the output signal $y_n$. These components of the digital filter in FIG. 13 are interconnected as illustrated.

The practical circuits of the parallel cyclic digital filter and cascade cyclic digital filter are similarly constructed but not shown.

A brief description is made of the operation time (i.e., delay time) of the direct cyclic digital filter by use of the latter's simplified form in FIG. 13. As with the setup of FIG. 12, assume that T1 is the time required by the adder 342 for addition and subtraction and that T2 is the time require by the coefficient multiplier 346 for coefficient multiplication. In that case, the delay time TD in the feedback loop is given as $$TD = 2 \times T1 + T2$$

The delay time TD determines the maximum operation frequency of the cyclic digital filter.

For example, suppose that the cyclic digital filter is utilized in the emphasis or de-emphasis circuit of a high definition VTR (video tape recorder) and that the clock frequency is 44.55 MHz. Here, the delay time of the unit time delay circuit 345 equals the clock time, while the delay time TD exceeds the delay time of the unit time delay circuit 345. For this reason, the direct cyclic digital filter shown in FIG. 12 or FIG. 13 cannot be employed in applications where such high frequencies are involved. The same problem persists with both the parallel cyclic digital filter and the cascade cyclic digital filter.

SUMMARY OF THE INVENTION:

It is therefore an object of the present invention to provide a cyclic digital filter that may be used for high frequency signal processing.

In carrying out the invention and according to one aspect thereof, there is provided a cyclic digital filter having a feedback loop circuit comprising at least a first unit time delay circuit for delaying an input signal by a unit time, a coefficient multiplier for multiplying the output from the unit time delay circuit by a predetermined coefficient, and an adder;.the adder subtracting from the input signal the result from the multiplication by the coefficient multiplier; wherein the coefficient of the coefficient multiplier is adjusted to maintain the characteristics of the cyclic digital filter in the presence of a second unit time delay circuit interposed between the coefficient multiplier and the adder.

The transfer function H(z) for the cyclic digital filter is given in the form of Equation (1). For the sake of brevity, the transfer function H(z) is expressed by Equation (4) when N=1:

$$H(z) = \frac{a_0 + a_1 z^{-1}}{1 + b_1 z^{-1}} \quad (4)$$

Multiplying the numerator and the denominator of Equation (4) by $(1-b_1z^{-1})$ provides Equation (5):

$$H(z) = \frac{(a_0 + a_1 z^{-1})(1 - b_1 z^{-1})}{(1 + b_1 z^{-1})(1 - b_1 z^{-1})} \quad (5)$$

$$= \frac{d_0 + d_1 z^{-1} + d_2 z^{-2}}{1 + c_2 z^{-2}}$$

As shown above, expressing the transfer function H(z) as $z^{-2}H(z)$ does not affect the characteristics of the cyclic digital filter; only the delay time is altered. This means that adding a second unit time delay circuit affords the delay time required by the adder and coefficient multiplier for their operations. Those changes in the filter characteristics which would ordinarily result from the addition of the second unit time delay circuit are prevented by adjusting the coefficient of the coefficient multiplier. Where a plurality of feedback loops exist, each loop is furnished with a second unit time delay circuit and a coefficient multiplier whose coefficient is suitable adjusted. If it is necessary to provide each feedback loop with an additional feedback circuit and a feedback loop circuit, or either of these circuits, such addition may be made.

The above alteration of the circuit arrangement applies not only to the direct cyclic digital filter but also to the parallel cyclic digital filter and the cascade cyclic digital filter.

Further objects, features and advantages of the invention will become more apparent upon a reading of the following description and appended drawings.

DESCRIPTION OF THE PREFERRED EMBODIMENTS

Figure 1:
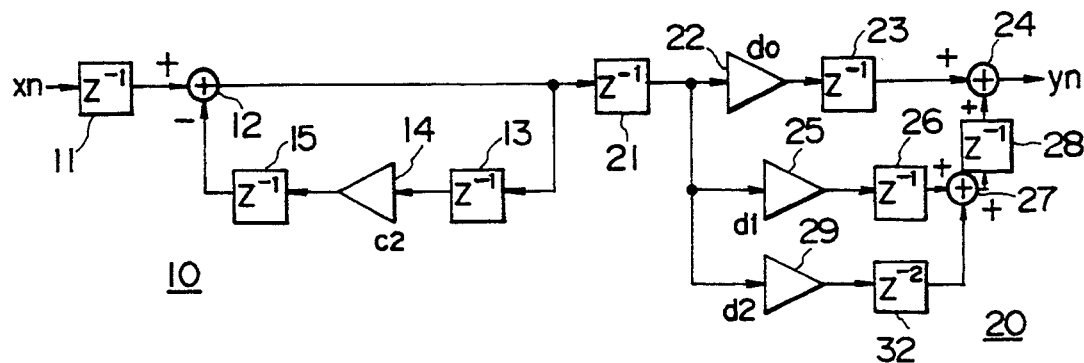
FIG. 1 is a circuit diagram of a direct cyclic digital filter practiced as a first embodiment of the invention.

Preferred embodiments of the invention will now be described with reference to the accompanying drawings. FIG. 1 is a circuit diagram of a direct cyclic digital filter embodying the invention when M=N=1. This circuit construction is comparable to that of FIG. 13.

The direct cyclic digital filter of FIG. 1 comprises a feedback loop circuit 10 and a feed-forward circuit 20 connected in series.

The feedback loop circuit 10 comprises a unit time delay circuit 11 that latches and delays the input signal $x_n$ for a unit time; an adder 12 that subtracts the delayed output of a unit time delay circuit 15 (to be described later) from the one-clock-pulse-delayed output of the unit time delay circuit 11; a unit time delay circuit 13 that latches and delays for a unit time the result of the subtraction performed by the adder 12; a coefficient multiplier 14 that multiplies the delayed output from the unit time delay circuit 13 by a coefficient $c_2$; and a unit time delay circuit 15 that latches and delays for a unit time the result of the multiplication by the coefficient multiplier 14. In operation, the delayed output of the unit time delay circuit 15 is fed to the adder 12 for subtraction thereby from the delayed output of the unit time delay circuit 11. That is, the adder 12, unit time delay circuit 13, coefficient multiplier 14 and unit time delay circuit 10 constitute negative feedback loop circuit.

The feed-forward circuit 20 has a unit time delay circuit 21 that latches and delays the output signal from the feedback loop circuit 10 for a unit time.

Furthermore, the feed-forward circuit 20 has a first, a second and a third feed-forward circuit. The first feed-forward circuit comprises a coefficient multiplier 22 that multiplies by a coefficient $d_0$ the delayed output from the unit time delay circuit 21; a unit time delay circuit 23 which is connected in series to the coefficient multiplier 22 and which latches and delays the result of the multiplication thereby for a unit time; and an adder 24 which is located on the output side of the unit time delay circuit 23 and which adds the delayed result therefrom and the delayed output from a lower-stage unit time delay circuit 28 (to be described later). The second feed-forward circuit contains a coefficient multiplier 20 that multiplies by a coefficient $d_1$ the delayed output from the unit time delay circuit 21; a unit time delay circuit 26 which is connected in series to the coefficient multiplier 25 and which latches and delays the result of the multiplication thereby for a unit time; and an adder 27 which is located on the output side of the unit time delay circuit 26 and which adds the delayed output therefrom and the delayed output From a lower-stage two-unit time delay circuit 32 (to be described later). The third feed-forward circuit includes a coefficient multiplier 29 that multiplies by a coefficient $d_2$ the delayed output from the unit time delay circuit 21, and a two-unit time delay circuit 32 which is connected in series to the coefficient multiplier 29 and which latches and delays the result of the multiplication thereby for two unit time periods.

In the first, second and third feed-forward circuits arranged substantially in parallel within the feed-forward circuit 20, the delayed output from the unit time delay circuit 21 is multiplied by coefficients, latched for unit time periods, and added concurrently and in parallel.

The two-unit time delay circuit 32 latches and delays data by two clock pulses, i.e., for two unit time periods. This is a circuit equivalent to an arrangement having two ordinary unit time delay circuits connected in series. Naturally the two-unit time delay circuit 32 may be replaced with two unit time delay circuits connected in series. In this specification, the unit time delay circuit refers to a single unit time delay circuit unless otherwise noted.

In the feed-forward circuit 20, the first, second and third feed-forward circuits are connected in cascade fashion. That is, the adder 24 is supplied with the output from the lower-stage unit time delay circuit 28, and the lower-stage adder 27 receives the output from the two-unit time delay circuit 32.

As described, the adder 27 adds the output from the two-unit time delay circuit 26 and the output from the unit time delay circuit 32. The result of the addition by the adder 27 is supplied to the adder 24 via the unit time delay circuit 28. The adder 24 adds the output from the unit time delay circuit 28 and the output from the unit time delay circuit 23, thereby generating the output signal $y_n$.

Figure 13:
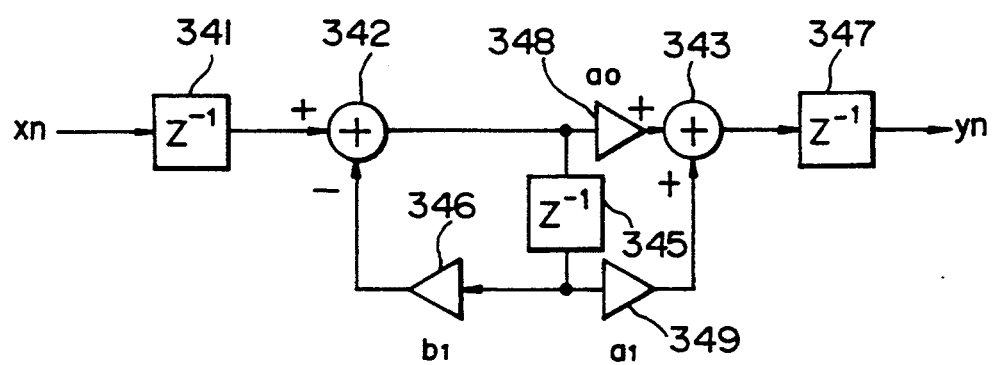
FIG. 13 is a circuit diagram depicting the practical structure of a simplified circuit example derived from the direct cyclic digital filter of FIG. 12.

Comparing the circuit construction of FIG. 1 with that of FIG. 13 reveals that in the feedback loop of FIG. 1, an additional unit time delay circuit 15 is interposed between a filter coefficient multiplier 14 and an adder 12. Unit time delay circuits 11 and 13 in FIG. 1 correspond respectively to unit time delay circuits 341 and 345 in FIG. 13. A unit time delay circuit 21 in FIG. 1 corresponds to a unit time delay circuit 347 in FIG. 13. The circuit construction comparable to the feed-forward circuit 20 of FIG. 1 is omitted from FIG. 13.

The transfer function H(z) for the cyclic digital filter of FIG. 1 is expressed by Equation (5). The filter coefficient of the coefficient multiplier 14 in FIG. 1 is made to differ from the coefficient of the setup in FIG. 13 so as to prevent those changes in filter characteristics that would ordinarily result from the addition of the unit time delay circuit 15. Accordingly the filter coefficient of the coefficient multiplier 22 in the feed-forward circuit 20 is readjusted.

In the direct cyclic digital filter of FIG. 1, adding the second unit time delay circuit 15 to the feedback loop circuit 10 doubles the unit delay time of the latter. One added unit delay time period ensures that much time for the adder 12 or coefficient multiplier 14 to operate in. This means that filtering is carried out without recourse to increasing the operation speeds of the circuit components making up the cyclic digital filter. Thus the filter characteristics remain unchanged.

In FIG. 1, the unit time delay circuits 11 and 21 function as latch circuits. The latch circuits are provided here to latch data for transition from one operation to another. However, these latch circuits are not essential to the spirit or scope of the invention and are omitted for space reasons from some of the circuit construction illustrations that follow.

Figure 2:
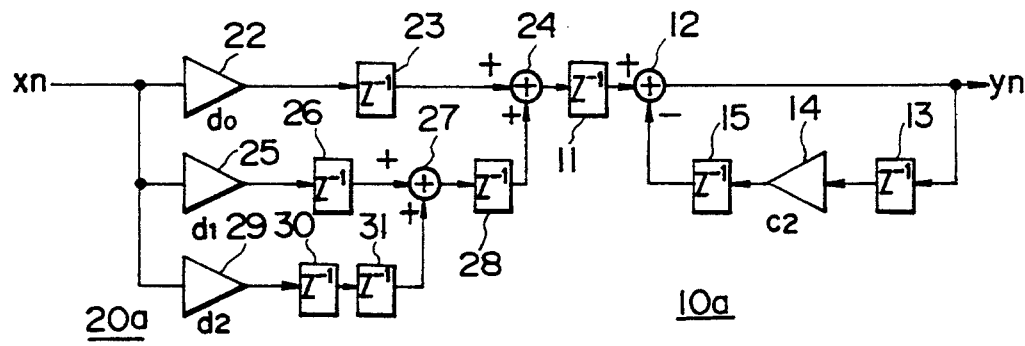
FIG. 2 is a circuit diagram of another direct cyclic digital filter practiced as a second embodiment of the invention.

FIG. 2 is a circuit diagram of another direct cyclic digital filter implemented when $M = N = 1$ as a variation of the embodiment in FIG. 1.

The cyclic digital filter of FIG. 2 comprises a feed-forward circuit 20a and a feedback loop circuit 10a connected in series.

The feed-forward circuit 20a is similar in structure to the feed-forward circuit 20 of FIG. 1, except that the unit time delay circuit 21 in FIG. 1 is excluded from the feed-forward circuit 20a of FIG. 2. The input signal $x_n$ is input directly to the coefficient multipliers 22, 25 and 29 for multiplication by the coefficients thereof. The numerals 22 through 29 designate the same circuit components in both FIGS. 1 and 2. The two-unit time delay circuit 32 in FIG. 1 is implemented in the setup of FIG. 2 as two separate unit time delay circuits 30 and 31.

In the feed-forward circuit 20a, the first, second and third feed-forward circuits multiply the input signal $x_n$ by the respective coefficients, latch and delay the results of the multiplications for the respective unit time periods, and add the delayed results concurrently and in parallel.

The feedback loop circuit 10a of FIG. 2 is the same in structure as the feedback loop circuit 10 Of FIG. 1, except that the circuit 10a performs negative feedback filtering on the result of the operation by the feed-forward circuit 20a. The result of the filtering is output as the output signal $y_n$. In FIGS. 1 and 2, like reference numerals designate like or corresponding parts.

Comparing the circuit construction of FIG. 2 with that of FIG. 1 reveals that the feed-forward circuits 20 and 20a in the two figures have switched their places crosswise, and so have the feedback loops 10 and 10a. The symmetrically reversed circuit positions have no effect on circuit performance. That is, the circuit construction of FIG. 1 may be symmetrically reversed as shown in FIG. 2 with no adverse effects; the circuit construction of FIG. 2 may be likewise reversed symmetrically as depicted in FIG. 1.

In the cyclic digital filter of FIG. 2, the feed-forward circuit 20a comprises three series circuits (three combinations of parts: 22 with 23, 25 with 26, 29 with 30) connected in parallel, each containing a coefficient multiplier (22, 25 or 29) and a unit time delay circuit. The coefficients ($d_0$, $d_1$ and $d_2$) of these coefficient multipliers correspond to those given by Equation (5). The feedback loop circuits in FIGS. 1 and 2 are the same in circuit structure.

As described, the two-unit time delay circuit 32 in the feed-forward circuit 20 of FIG. 1 is comparable substantially to the two unit t[i]me delay circuits 30 and in the feed-forward circuit 20a of FIG. 2. Given these features, the circuit of FIG. 1 and that of FIG. 2 are substantially the same.

Figure 3:
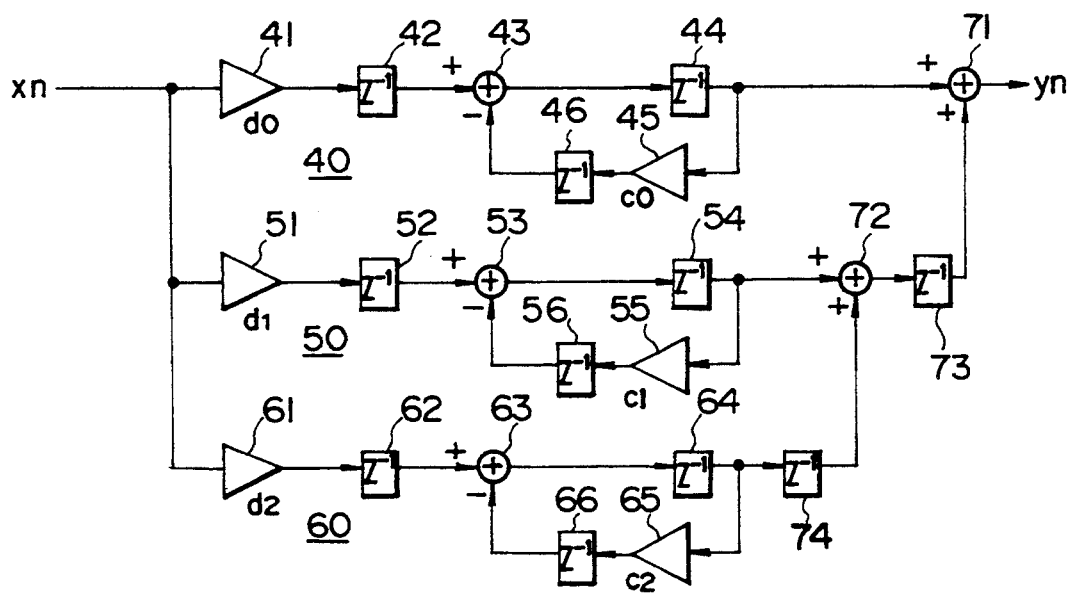
FIG. 3 is a circuit diagram of a parallel direct cyclic digital filter practiced as a third embodiment of the invention.

FIG. 3 is a circuit diagram of a parallel cyclic digital filter implemented as another embodiment of the invention on the assumption that $M = N = 1$.

The parallel cyclic digital filter of FIG. 3 comprises a first, a second and a third cyclic digital filter circuit 40, 50 and 60 connected substantially in parallel.

The first cyclic digital filter circuit 40 contains a coefficient multiplier 41 that multiplies the input signal $x_n$ by a coefficient $d_0$ a unit time delay circuit 42 that latches and delays for a unit time the result of the multiplication by the coefficient multiplier 41 an adder 43 that subtracts from the delayed output of the unit time delay circuit 42 the delayed output of a unit time delay circuit 4 (to be described later); a unit time delay circuit 44 that latches and delays for a unit time the result of the addition by the adder 43; a coefficient multiplier 45 that multiplies the delayed output from the unit time delay circuit 44 by a coefficient $c_0$; and the unit time delay circuit 4 that latches and delays for a unit time the result of the multiplication by the coefficient multiplier 45. The adder 43, unit time delay circuit 44, coefficient multiplier 45 and unit time delay circuit 46 constitute a negative feedback loop circuit.

The circuit construction of the first cyclic digital filter circuit 40 is comparable to that in FIG. 2 which comprises the coefficient multiplier 22, unit time delay circuit 23, adder 24, adder 12, unit time delay circuit 13, coefficient multiplier 14 and unit time delay circuit 15 in the upper stage.

The second cyclic digital filter circuit 50 and the third cyclic digital filter circuit 60 are each similar in construction to the first cyclic digital filter circuit 40. One difference is that the coefficients of the coefficient multipliers 51 and 61 are $d_1$ and $d_2$, respectively, compared with do for the coefficient multiplier 41. Another difference is that the coefficients of the coefficient multipliers 55 and 65 are $c_1$ and $c_2$, respectively, compared with $c_0$ for the coefficient multiplier 45.

The first through he third cyclic digital filter circuits 40, 50 and 60 simultaneously multiply the input signal $x_n$ by the respective coefficients thereof, and latch and delay the results of the multiplications for the respective unit times for negative feedback filtering.

The parallel processed results are added consecutively by adders 72 and 71. That is, the output of the third cyclic digital filter 60 is fed to the upper-stage adder 72 via the unit time delay circuit 74. The adder 72 adds the output of the third cyclic digital filter circuit 60 and the delayed output of the unit time delay circuit 54 in the second cyclic digital filter circuit 50. The result of the addition by the adder 72 is latched by a unit time delay circuit 73 for a unit time before being sent to the upper-stag adder 71. The adder 71 adds the output of the unit time delay circuit 73 and the latched and delayed output from the unit time delay circuit 44 in the first cyclic digital filter circuit 40, thereby generating the output signal $y_n$.

The transfer function H(z) of the parallel cyclic digital filter in FIG. 3 is expressed by Equation (5) above.

Figure 4:
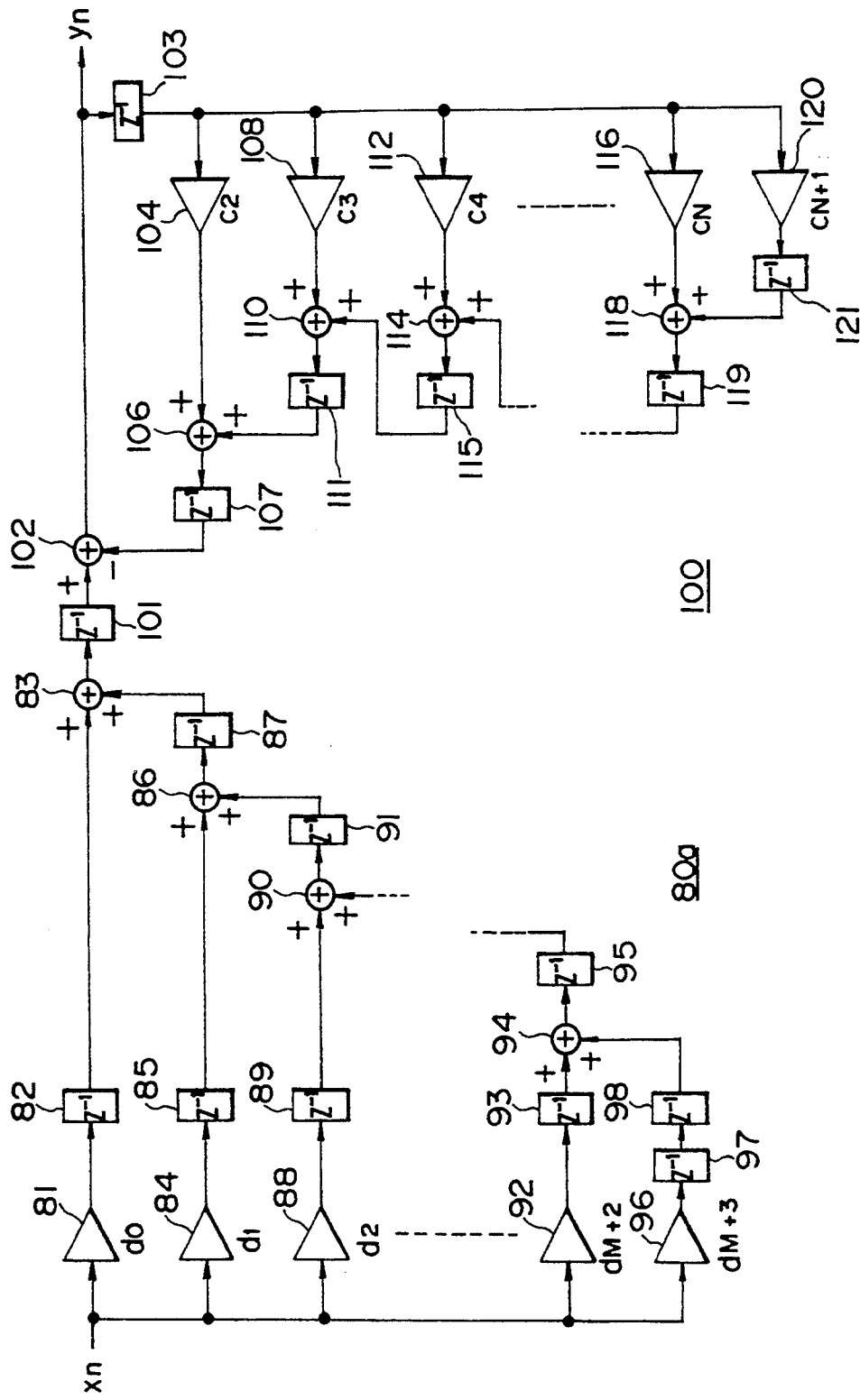
FIG. 4 is a circuit diagram of another direct cyclic digital filter practiced as a fourth embodiment of the invention.
Figure 12:
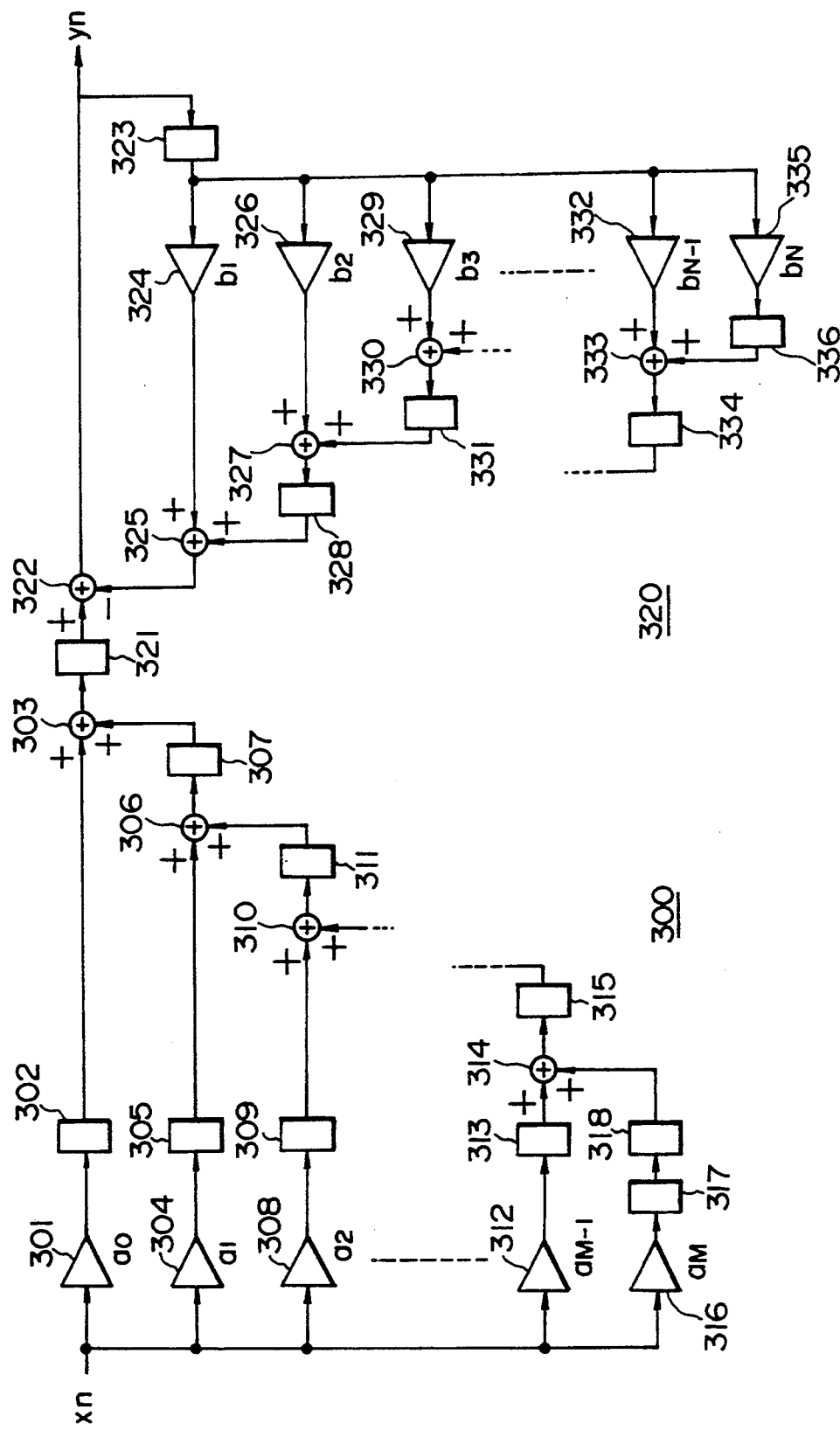
FIG. 12 is a circuit diagram showing the practical structure of a prior art direct cyclic digital filter.

FIG. 4 is a circuit diagram of another direct cyclic digital filter whose practical structure is shown in FIG. 12. The cyclic digital filter of FIG. 4 comprises a feed-forward circuit 80 to which the input signal $x_n$ is supplied, and a feedback loop circuit 100 which is connected in series to the feed-forward circuit 80 and which outputs the output signal $y_n$.

The feed-forward circuit 80 has a first feed-forward circuit, a second feed-forward circuit, a third feed-forward circuit...., an (M+2+1=M+3)th feed-forward circuit, and an (M+3+1=M+4)th feed-forward circuit. The first feed-forward circuit contains a coefficient multiplier 81 that multiplies the input signal $x_n$ by the coefficient $d_0$; a unit time delay circuit 82 that latches and delays for a unit time the result of the multiplication by the coefficient multiplier 81; and an adder 83 that adds the delayed output from the unit time delay circuit 82 and the delayed output from a lower-stage unit time delay circuit 87 (to be described later). The second feed-forward circuit comprises a coefficient multiplier 84 that multiplies the input signal $x_n$ by the coefficient $d_1$; a unit time delay circuit 85 that latches and delays for a unit time the result of the multiplication by the coefficient multiplier 84; and an adder 86 that adds the delayed output from the unit time delay circuit 85 and the delayed output from a lower-stage unit time delay circuit 91 (to be described later). The third feed-forward circuit includes a coefficient multiplier 88 that multiplies the input signal $x_n$ by the coefficient $d_2$; a unit time delay circuit 89 that latches and delays for a unit time the result of the multiplication by the coefficient multiplier 88; and an adder 90 that adds the delayed output from the unit time delay circuit 89 and the delayed output from a lower-stage unit time delay circuit, not shown. The (M+2+1=M+3)th feed-forward circuit has a coefficient multiplier 92 that multiplies the input signal $x_n$ by a coefficient $d_{M+2}$; a unit time delay circuit 93 that latches and delays for a unit time the result of the multiplication by the coefficient multiplier 92; and an adder 94 that adds the delayed output from the unit time delay circuit 93 and the delayed output from a lower-stage unit time delay circuit 98. The (M+3+1=M+4)th feed-forward circuit comprises a coefficient multiplier 96 that multiplies the input signal $x_n$ by a coefficient $d_{M+3}$; a unit time delay circuit 9 that latches and delays for a unit time the result of the multiplication by the coefficient multiplier 96 and the unit time delay circuit 98 that latches and delays for a unit time the delayed output from the unit time delay circuit 97.

In this feed-forward circuit 80, the delayed output from a lower-stage unit time delay circuit (e.g., circuit 87) is fed to an upper-stage adder (e.g., adder 83). The adder adds the delayed output it received and the one-clock-pulse-delayed result from the unit time delay circuit (e.g., circuit 82) at the same stage as the adder.

The feedback loop circuit 100 has a unit time delay circuit 101, an adder 102 and another unit time delay circuit 103. The unit time delay circuit 101 latches and delays for a unit time the result of the operation by the feed-forward circuit 8C). The adder 102 subtracts from the latched and delayed output of the unit time delay circuit 101 the delayed output of a unit time delay circuit 107, to be described later, thereby generating the output signal $y_n$. The unit time delay circuit 103 latches and delays the output signal $y_n$ for a unit time.

Furthermore, the feedback loop circuit 100 includes a plurality of feedback loop circuits that are connected in parallel and in cascade fashion.

A first feedback loop circuit of the feedback loop circuit 100 comprises coefficient multiplier 104 that multiplies by the coefficient $c_2$ the delayed output signal $y_n$ coming from the unit time delay circuit 103; an adder 106 that adds the result of the multiplication by the coefficient multiplier 104 and the delayed output from a unit time delay circuit 111 (to be described later); and a unit time delay circuit 107 that supplies the upper-stage adder 102 with the result of the addition by the adder 106 as a subtraction signal.

A second feedback loop circuit of the feedback loop circuit 100 contains a coefficient multiplier 108 that multiplies by a coefficient $c_3$ the delayed output signal $y_n$ from the unit time delay circuit 103; an adder 110 that adds the result of the multiplication by the coefficient multiplier 108 and the delayed result from a unit time delay circuit 115 (to be described later); and a unit time delay circuit 111 that supplies the upper-stage adder 106 with the result of the addition by the adder 110 as an addition signal.

A third feedback loop circuit of the feedback loop circuit 100 includes a coefficient multiplier 112 that multiplies by a coefficient c4 the delayed output signal $y_n$ from the unit time delay circuit 103; an adder 114 that adds the result of the multiplication by the coefficient multiplier 112 and the delayed output from a lower-stage unit time delay circuit, not shown; and a unit time delay circuit 115 that supplies the upper-stage adder 110 with the result of the addition by the adder 114 as an addition signal.

Further feedback loop circuits are likewise arranged in parallel within the feedback loop circuit 100. These circuits include an (N−1)th and an N-th feedback loop circuit connected in parallel.

The (N−1)th feedback loop circuit of the feedback loop circuit 100 comprises a coefficient multiplier 116 that multiplies by a coefficient $c_N$ the delayed output signal $y_n$ from the unit time delay circuit 103; an adder 118 that adds the result of the multiplication by the coefficient multiplier 116 and the delayed output from a unit time delay circuit (to be described later); and a unit time delay circuit 119 that supplies an upper-stage adder, not shown, with the result of the addition by the adder 118 as an addition signal.

The N-th feedback loop circuit of the feedback loop circuit 100 has a coefficient multiplier 120 that multiplies by a coefficient $C_{N+1}$ the delayed output signal $y_n$ from the unit time delay circuit 103; and a unit time delay circuit 121 that supplies the upper-stage adder 118 with the result of the multiplication by the coefficient multiplier 120 as an addition signal.

Put another way, the feedback loop circuit 100 has the unit time delay circuit 119 that latches the result of the addition by the adder 118 before sending it to an upper-stage adder; . . . ; the unit time delay circuit 115 that latches the result of the addition by the adder 114 before sending it to the upper-stage adder 110; the unit time delay circuit 111 that latches the result of the addition by the adder 110 before sending it to the upper-stage adder 106; and the unit time delay circuit 107 that latches the result of the addition by the adder 106 before sending it to the upper-stage adder 102. The adder 102 outputs the output signal $y_n$.

The above-described direct cyclic digital filter embodies the invention on the assumption that N is at least 2. The transfer function H(z) of this filter is expressed by Equation (6):

$$H(z) = \frac{\sum_{\mu=0}^{M} a_\mu \cdot z^{-\mu}}{1 + \sum_{\nu=2}^{N} b_\nu \cdot z^{-\nu}} \quad (N \geq M) \tag{6}$$

$$= \frac{\sum_{\mu=0}^{M} a_\mu \cdot z^{-\mu}}{1 + b_1 \cdot z^{-1} + \sum_{\nu=2}^{N} b_\nu \cdot z^{-\nu}} \cdot \frac{(1 - b_1 z^{-1})}{(1 - b_1 z^{-1})}$$

$$= \frac{\sum_{\mu=0}^{M+1} d_\mu \cdot z^{-\mu}}{1 + \sum_{\nu=2}^{N+1} c_\nu \cdot z^{-\nu}}$$

where $$d_\mu = \begin{cases} a_0 & (\mu = 0) \\ a_\mu - b_1 \cdot a_{\mu-1} & (1 \leq \mu \leq M) \\ -b_1 \cdot a_M & (\mu = M + 1) \end{cases}$$

$$c_\nu = \begin{cases} -b_1^2 + b_2 & (\nu = 2) \\ b_\nu - b_1 \cdot b_{\nu-1} & (3 \leq \nu \leq N) \\ -b_1 \cdot b_N & (\nu = N + 1) \end{cases}$$

From Equation (6), the coefficient d of the coefficient multiplier in the feed-forward circuit of FIG. 4 and the coefficient dv of the coefficient multiplier in the feedback loop of the same figure are determined.

A comparison of the circuit construction of the cyclic digital filter in FIG. 4 with that of the filter in FIG. 12 shows that the feedback loop circuit 100 of the cyclic digital filter in FIG. 4 has the additional unit time delay circuit 107 interposed between the adders 106 and 101, the latter functioning as an adder-subtracter. This means that the cyclic digital filter of FIG. 4 provides the adders 106 and 101 with an additional unit delay time afforded by the unit time delay circuit 107.

Figure 5:
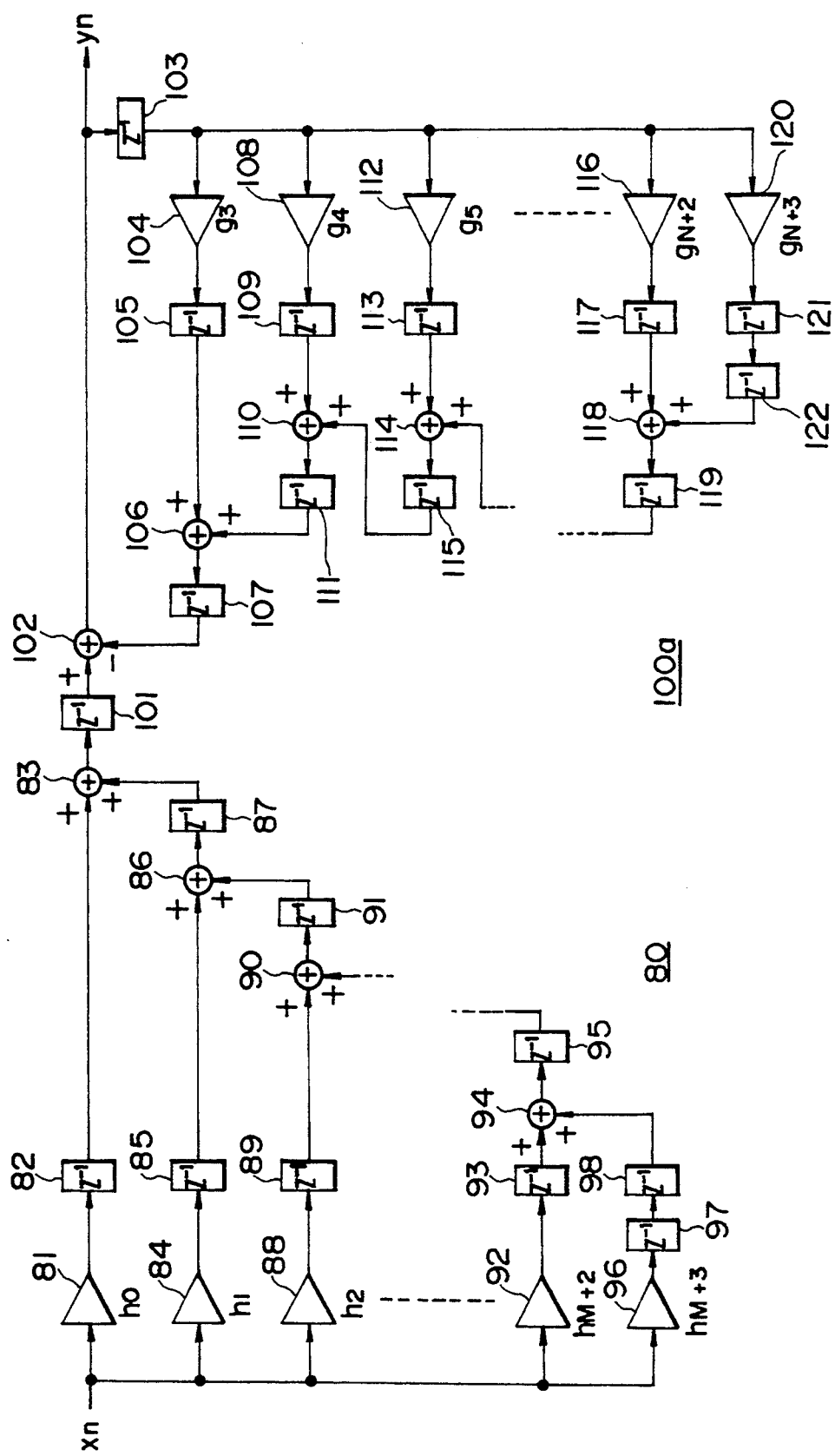
FIG. 5 is a circuit diagram of another direct cyclic digital filter which is an improved version of the embodiment of FIG. 4 and which is practiced as a fifth embodiment of the invention.

FIG. 5 is a circuit diagram of a cyclic digital filter improved over the circuit construction shown in FIG. 4. The filter of FIG. 5 is similar in construction to the cyclic digital filter of FIG. 4, the former comprising a feed-forward circuit 80a and a feedback loop circuit 100a.

The feed-forward circuit 80a is substantially the same in construction as the feed-forward circuit 80 in FIG. 5. The difference is that the coefficient multipliers 81, 84, 88 . . . , 92 and 96 have coefficients $d_0, d_2, \ldots, d_{M+2}$ and $d_{M+3}$ respectively in the construction of FIG. 4, compared with the corresponding coefficients $h_0, h_1, h_2, \ldots, h_{M+2}$ and $h_{M+3}$ in the construction of FIG. 5.

The feedback loop circuit 100a too is substantially the same in construction as the feedback loop circuit 100 in FIG. 4. The difference is that the coefficient multipliers 104, 108, 112, . . . , 116 and 120 have coefficients $c_2, c_3, c_4, \ldots, C_N$ and $C_{N+1}$ respectively in the construction of FIG. 4, compared with the corresponding coefficients $g_3, g_4, g_5, \ldots, g_{N+2}$ and $g_{N+3}$ in the construction of FIG. 5.

The workings of the circuit in FIG. 5 are represented by Equation (7) obtained by modifying Equation (6):

$$H(z) = \frac{\sum_{\mu=0}^{M+1} d_\mu \cdot z^{-\mu}}{1 + c_2 \cdot z^{-2} + \sum_{\nu=3}^{N+1} c_\nu \cdot z^{-\nu}} \cdot \frac{(1 - c_2 \cdot z^{-2})}{(1 - c_2 \cdot z^{-2})} \tag{7}$$

$$= \frac{\sum_{\mu=0}^{M+3} h_\mu \cdot z^{-\mu}}{1 + \sum_{\nu=3}^{N+3} g_\nu \cdot z^{-\nu}}$$

where $$h_\mu = \begin{cases} d_\mu & (0 \leq \mu \leq 1) \\ d_\mu - c_2 \cdot d_{\mu-2} & (2 \leq \mu \leq M + 1) \\ -c_2 \cdot d_{\mu-2} & (M + 2 \leq \mu \leq M + 3) \end{cases}$$

$$g_v = \begin{cases} c_3 & (v = 3) \\ -c_2{}^2 + c_4 & (v = 4) \\ c_v - c_2 \cdot c_{v-2} & (5 \leq v \leq N + 1) \\ -c_2 \cdot c_{v-2} & (N + 2 \leq v \leq N + 3) \end{cases}$$

From Equation (7), the coefficient $h\mu(\mu=0-M+3)$ of the coefficient multiplier in the feed-forward circuit 80a and the coefficient $gv(v=3-N+3)$ of the coefficient multiplier in the feedback loop 100a are determined.

In the circuit construction of FIG. 5, a plurality of series circuits constitute the feedback loop 100a. Each series circuit contains a second unit time delay circuit between coefficient multiplier and adder. For example, a second unit time delay circuit 105 is interposed between the coefficient multiplier 104 and the adder 106. Thus the coefficient multiplier 104 is provided for its operation with the delay time from the unit time delay circuit 105.

Figure 6:
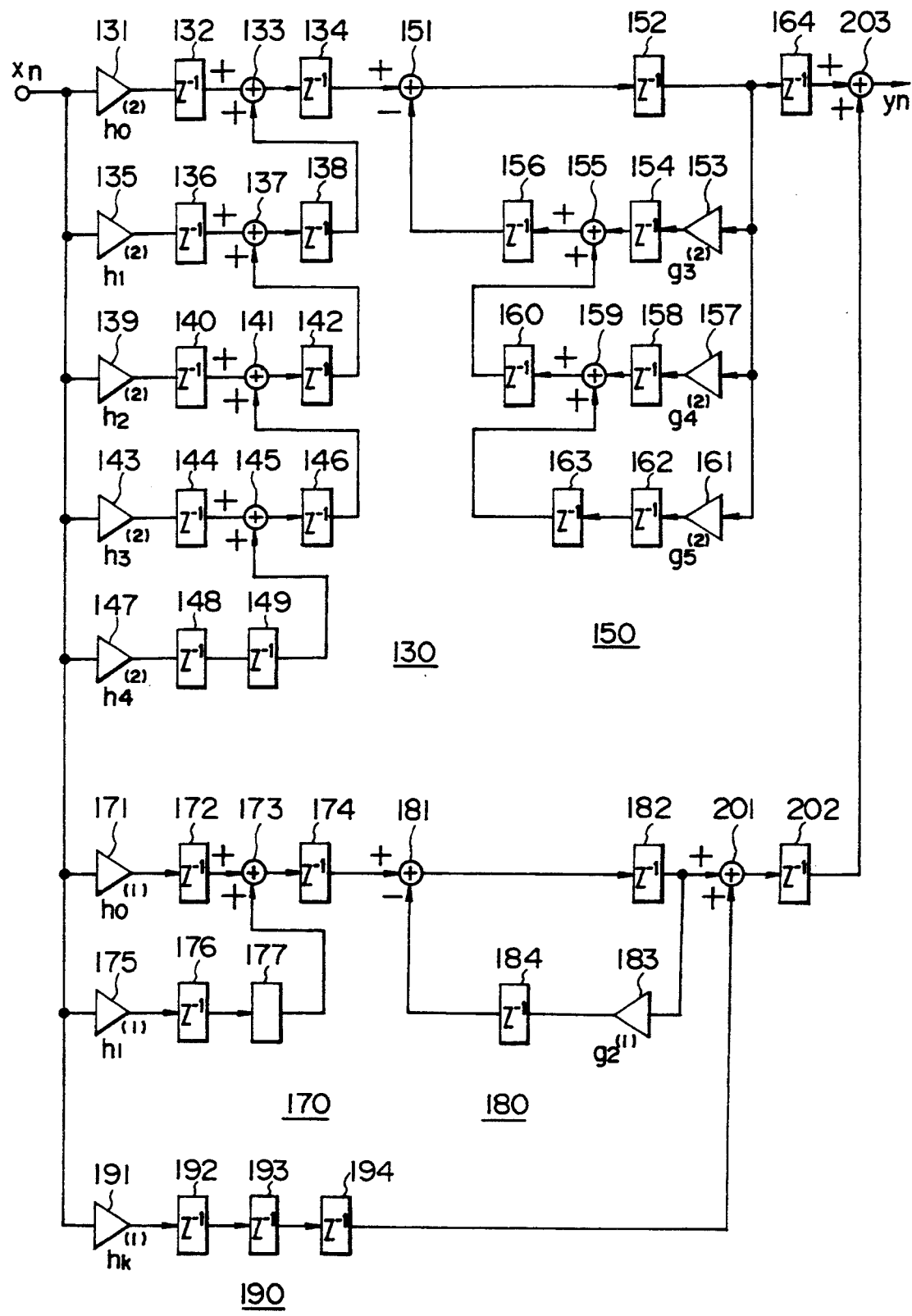
FIG. 6 is a circuit diagram of a parallel cyclic digital filter practiced as a sixth embodiment of the invention.
Figure 10:
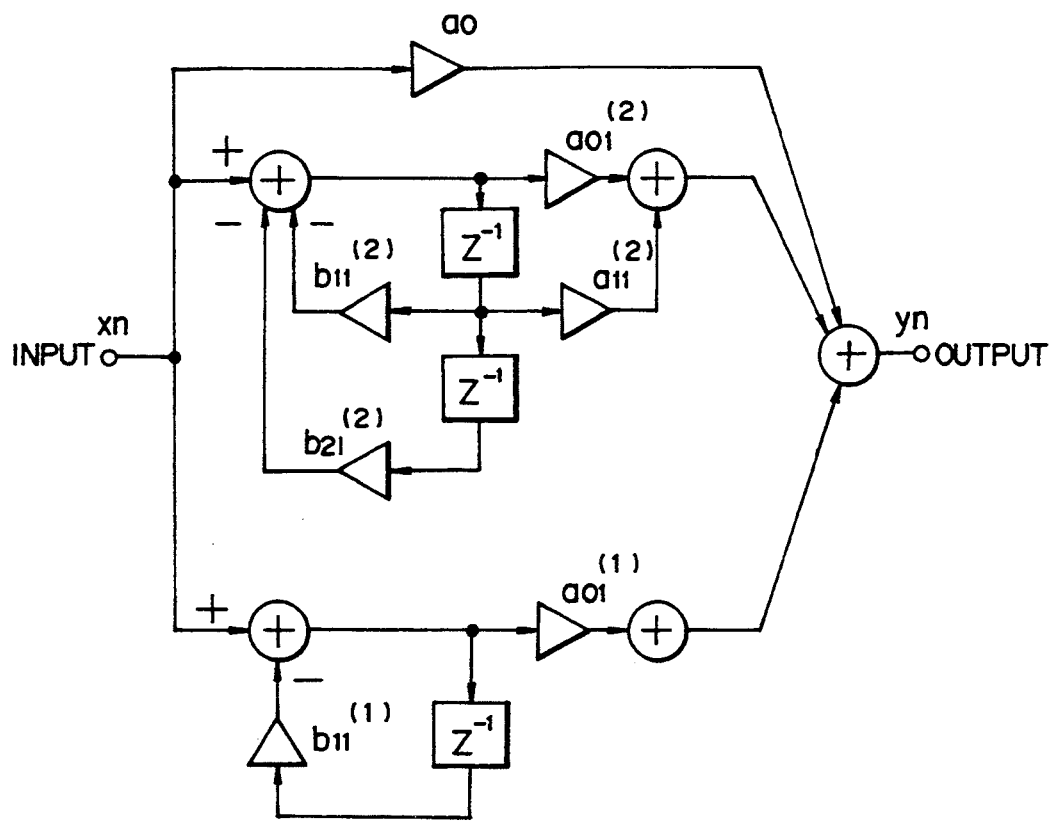
FIG. 10 is a circuit diagram illustrating the theoretical structure of a typical parallel cyclic digital filter.

FIG. 6 is a circuit diagram of a parallel cyclic digital filter embodying the invention. The theoretical structure of this filter is illustrated in FIG. 10. The parallel cyclic digital filter of FIG. 6 comprises a first feed-forward circuit 130, a first feedback loop circuit 150 corresponding to the first feed-forward circuit 130, a second feed-forward circuit 170, a second feedback loop circuit 180 corresponding to the second feed-forward circuit 170, and a third feed-forward circuit 190.

The first feed-forward circuit 130 has first through fifth feed-forward circuits arranged substantially in parallel and connected in cascade fashion.

The first of these feed-forward circuits comprises a coefficient multiplier 131 having a coefficient $h_0{}^{(2)}$, a unit time delay circuit 132, an adder 133 and a unit time delay circuit 134. The second feed-forward circuit contains a coefficient multiplier 135 having a coefficient $h_1{}^{(2)}$, a unit time delay circuit 136, an adder 137, and a unit time delay circuit 138. The third feed-forward circuit includes a coefficient multiplier 139 having a coefficient $h_2{}^{(2)}$, a unit time delay circuit 140, an adder 141, and a unit time delay circuit 142. The fourth feed-forward circuit comprises a coefficient multiplier 143 having a coefficient $h_3{}^{(2)}$, a unit time delay circuit 144, an adder 145, and a unit time delay circuit 146. The fifth feed-forward circuit-contains a coefficient multiplier 147 having a coefficient $h_4{}^{(2)}$, and unit time delay circuits 148, and 149.

The adder 133 is supplied with the delayed output from the lower-state unit time delay circuit 138; the adder 137 is supplied with the delayed output from the lower-stage unit time delay circuit 142; the adder 141 is provided with the delayed output from the lower-stage unit time delay circuit 146; and he adder 145 is furnished with the delayed output from the lower-stage unit time delay circuit 149. These lower-stage unit time delay circuits are used to provide the timings of their respective upper-stage adders.

The first feedback loop circuit 150 has an adder 151 and unit time delay circuits 152 and 164. The adder 151 functions as a subtracter that subtracts the delayed output of a unit time delay circuit 156 (to be described later) from the result of the operation by the feed-forward circuit 130. The unit time delay circuit 152 latches and delays the result of the subtraction by the adder 151 for a unit time. The unit time delay circuit 164 latches and delays the result of the subtraction for another unit time.

The first feedback loop circuit 150 further comprises a first, a second and a third feedback loop circuit. The first of these feedback loop circuits contains a coefficient multiplier 153 that multiplies by a coefficient $g_3{}^{(2)}$ the delayed output from the unit time delay circuit 152; a unit time delay circuit 154 that latches and delays the result of the multiplication by the coefficient multiplier 153; an adder 155 that adds the delayed output from the unit time delay circuit 154 and the delayed output from a lower-stage unit time delay circuit 160; and a unit time delay circuit 156 that supplies the upper-stage adder 151 with the result of the addition by tile adder 155 as a subtraction signal. The second feedback loop circuit includes a coefficient multiplier 157 that multiplies the delayed output from the unit time delay circuit 152 by a coefficient $g_4{}^{(2)}$; a unit time delay circuit 158 that latches and delays for a unit time the result of the multiplication by the coefficient multiplier 157; an adder 159 that adds the delayed output from the unit time delay circuit 158 and the delayed output from a lower-stage unit time delay circuit 163 (to be described later); and a unit time delay circuit 160 that supplies the upper-stage adder 155 with the result of the addition by the adder 159 as an addition signal. The third feedback loop circuit comprises a coefficient multiplier 161 that multiplies the delayed output from the unit time delay circuit 152 by a coefficient $g_5{}^{(2)}$; a unit time delay circuit 162 that latches and delays the result of the multiplication by the coefficient multiplier 161; and a unit time delay circuit 163 that latches and delays for another unit time the delayed output from the unit time delay circuit 162.

As described, besides receiving the output from the feed-forward circuit 130, the adder 151 is supplied with the output from the lower-stage unit time delay circuit 156 as the subtraction signal. The adder 155 is supplied with the output from the lower-stage unit time delay circuit 160, and the adder 159 is furnished with the output from the lower-stage unit time delay circuit 163. These lower-stage unit time delay circuits are used to provide the timings of their respective upper-stage adders.

The second feed-forward circuit 170 includes a first and a second feed-forward circuit. The first feed-forward circuit comprises a coefficient multiplier 171 that multiplies the input signal $x_n$ by a coefficient $h_0{}^{(1)}$; a unit time delay circuit 172 that latches and delays the result of the multiplication by the coefficient multiplier 171; an adder 173 that adds the delayed output from the unit time delay circuit 172 and the delayed output from a lower-stage unit time delay circuit 177 (to be described later); and a unit time delay circuit 174 that latches and delays the result of the addition by the adder 173. The second feed-forward circuit has a coefficient multiplier 175 that multiplies the input signal $x_n$ by a coefficient $h_1{}^{(1)}$; a unit time delay circuit 1 that latches and delays for a unit time the result of the multiplication by the coefficient multiplier 175; and a unit time delay circuit 177 that latches and delays for another unit time the delayed output from the unit time delay circuit 17.

The second feedback loop circuit 180 comprises an adder 181, a unit time delay circuit 182, a coefficient multiplier 183 ad a unit time delay circuit 184. The adder 181 functions as a subtracter that subtracts the delayed output of the unit time delay circuit 184 from the result of the operation by the second feed-forward circuit 170. The unit time delay circuit 182 latches and delays for a unit time the result of the subtraction by the adder 181. The coefficient multiplier 183 multiplies by a coefficient $g_2^{(1)}$ the delayed output from the unit time delay circuit 182. The unit time delay circuit 184 latches and delays fop a unit time the result of the multiplication by the coefficient multiplier 183.

The third feed-forward circuit 190 comprises a coefficient multiplier 191 having a coefficient $h_1^{(1)}$, and three unit time delay circuits 192, 193 and 194 connected in series for three-clock-pulse delay.

Furthermore, the cyclic digital filter of FIG. 6 includes an adder 201 that adds the output from the third feed-forward circuit 190 and the output from the second feedback loop circuit 180; a unit time delay circuit 202 that latches the result of the addition by the adder 201; and an adder 203 that adds the output from the unit time delay circuit 202 and the output from the unit time delay circuit 14 of the first feedback loop circuit 150.

The coefficients of the coefficient multipliers contained in the above cyclic digital filter are listed in Table 1 below.

TABLE 1

Figure 7:
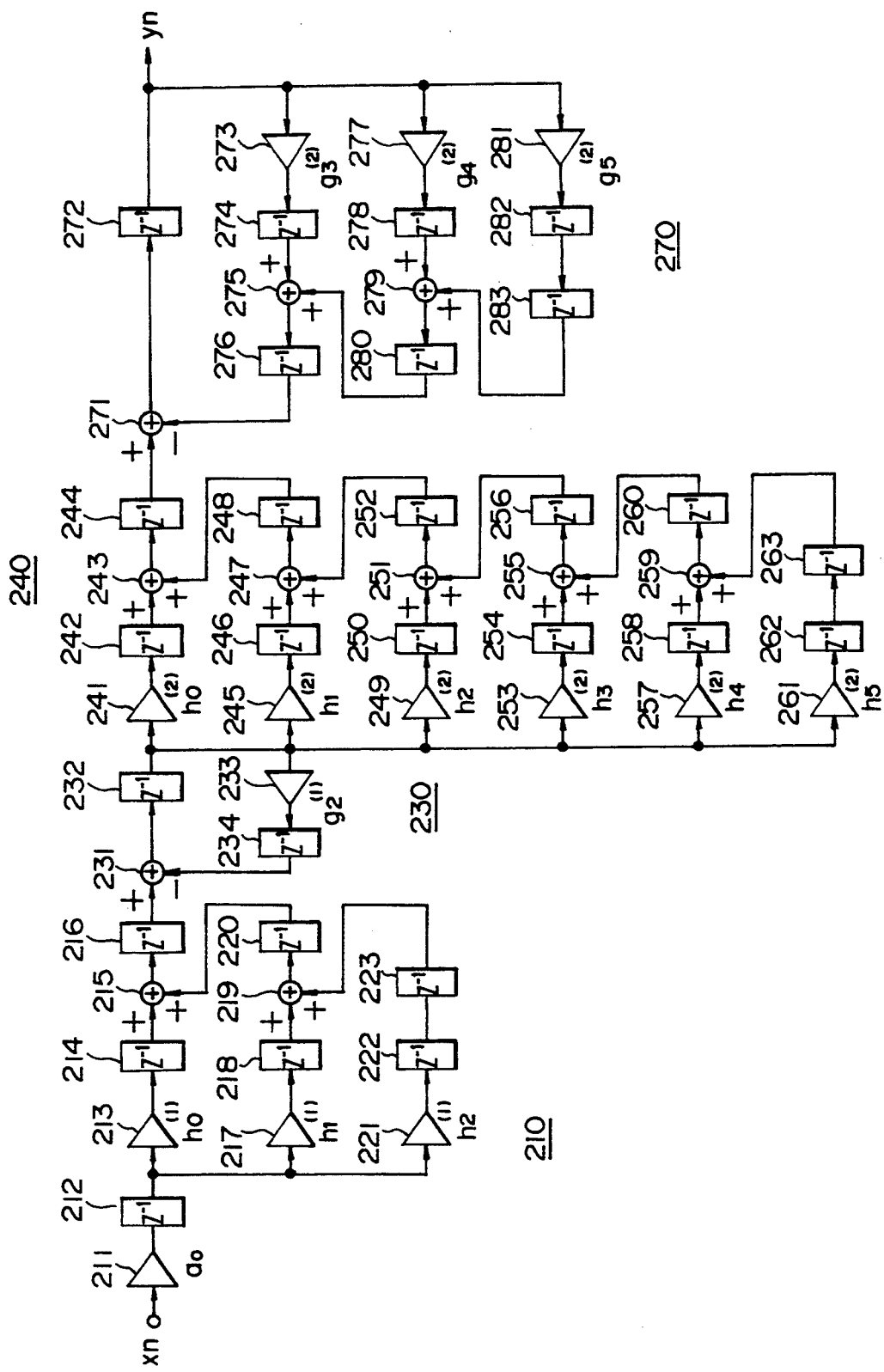
FIG. 7 is a circuit diagram of a cascade cyclic digital filter practiced as a seventh embodiment of the invention.
Figure 8:
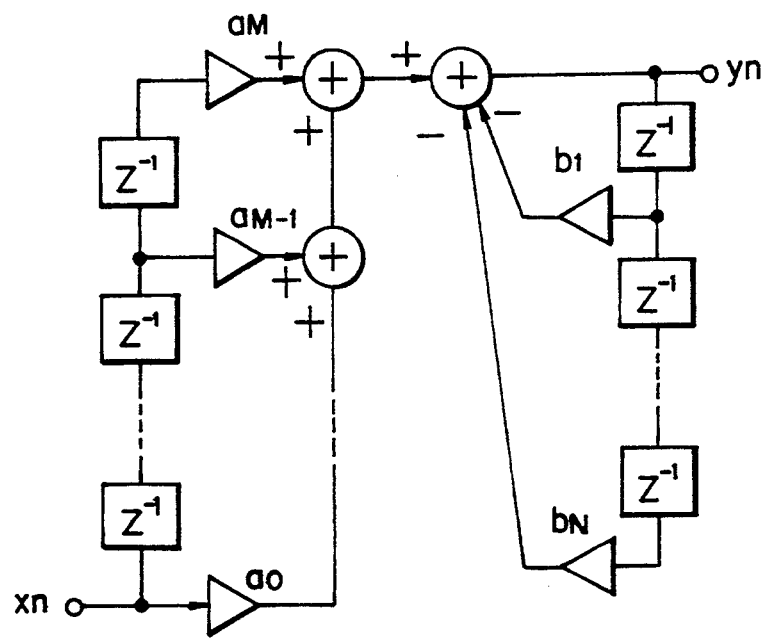
FIG. 8 is a circuit diagram showing the theoretical structure of a typical direct cyclic digital filter.
Figure 9:
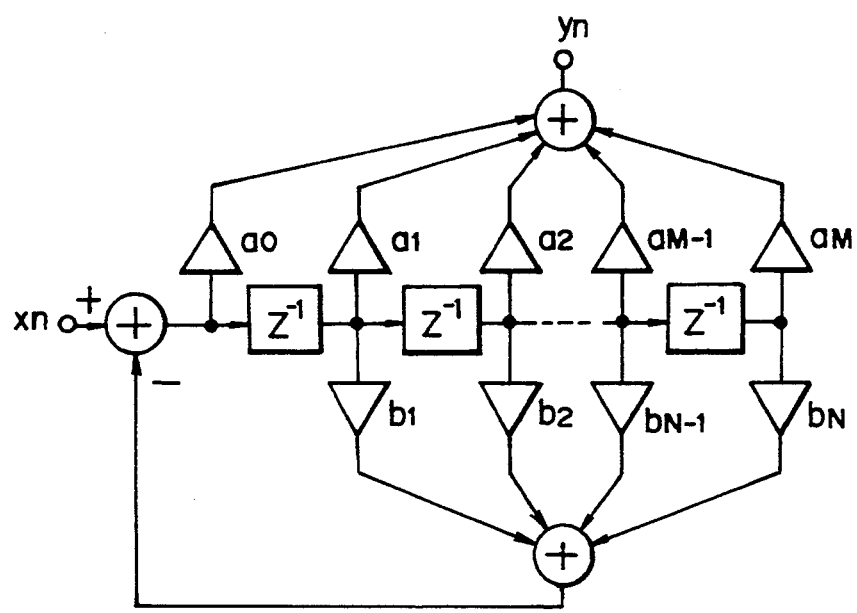
FIG. 9 is a circuit diagram depicting the theoretical structure of another direct cyclic digital filter.
Figure 11:
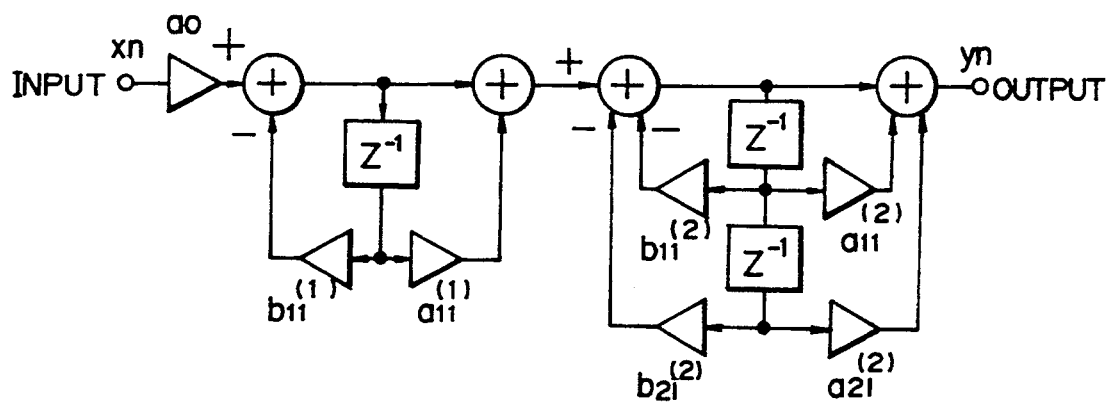
FIG. 11 is a circuit diagram describing the theoretical structure of a typical cascade cyclic digital filter.

$h_0^{(0)} = a_0$ $h_0^{(1)} = a_{01}^{(1)}$ $h_1^{(1)} = -a_{01}^{(1)} \cdot b_{11}^{(1)}$ $g_2^{(1)} = -[b_{11}^{(1)}]^2$ $h_0^{(2)} = a_{01}^{(2)}$ $h_1^{(2)} = a_{11}^{(2)} - a_{01}^{(2)} \cdot b_{11}^{(2)}$ $h_2^{(2)} = -a_{11}^{(2)} \cdot b_{11}^{(2)} - a_{01}^{(2)} \cdot [b_{21}^{(2)} - (b_{11}^{(2)})^2]$ $h_3^{(2)} = -(a_{11}^{(2)} - a_{01}^{(2)} \cdot b_{11}^{(2)}) \times [b_{21}^{(2)} - (b_{11}^{(2)})^2]$ $h_4^{(2)} = -[b_{21}^{(2)} - (b_{11}^{(2)})^2] \cdot a_{11}^{(2)} \cdot b_{11}^{(2)}$ $g_3^{(2)} = -b_{11}^{(2)} \cdot b_{21}^{(2)}$ $g_4^{(2)} = -[b_{21}^{(2)} - (b_{11}^{(2)})^2]^2$ $g_5^{(2)} = b_{11}^{(2)} \cdot b_{21}^{(2)} \cdot [b_{21}^{(2)} - (b_{11}^{(2)})^2]$ FIG. 7 is a circuit diagram of a cascade cyclic digital filter embodying the invention. The theoretical structure of this filter is depicted in FIG. 11. The cascade cyclic digital filter of FIG. 7 comprises a first feed-forward circuit 210, a first feedback loop circuit 230, a second feed-forward circuit 240, and a second feedback loop circuit 270, all connected in cascade fashion The first feed-forward circuit 210 has a first, a second and a third feed-forward circuit connected in cascade fashion. The first feed-forward circuit comprises a coefficient multiplier 211 that multiplies the input signal $x_n$ by the coefficient $a_0$; a coefficient multiplier 213 having the coefficient $h_0^{(1)}$; a unit time delay circuit 214; an adder 215; and a unit time delay circuit 216. The second feed-forward circuit includes a coefficient multiplier 217 having the coefficient $h_1^{(1)}$, a unit time delay circuit 218, an adder 219, and a unit time delay circuit 220. The third feed-forward circuit contains a coefficient multiplier 221 having the coefficient $h_2^{(1)}$, a unit time delay circuit 222, and another unit time delay circuit 223. The adder 215 is supplied with the output from the lower-stage unit time delay circuit 220, and the adder 219 is supplied with the output from the lower-stage unit time delay circuit 223.

The first feedback loop circuit 230 is composed of an adder 231, a unit time delay circuit 232, a coefficient multiplier 233 having the coefficient $g_2^{(1)}$, and a unit time delay circuit 234.

The second feed-forward circuit 240 comprises six feed-forward circuits arranged in parallel and connected in cascade fashion. Each of these feed-forward circuits will be described below.

The first feed-forward circuit in the second feed-forward circuit 240 contains a coefficient multiplier 241 having the coefficient $h_0^{(2)}$, a unit time delay circuit 242, an adder 243, and a unit time delay circuit 244.

The second feed-forward circuit in the second feed-forward circuit 240 includes a coefficient multiplier 245 having the coefficient $h_1^{(2)}$, a unit time delay circuit 246, an adder 247, and a unit time delay circuit 248.

The third feed-forward circuit in the second feed-forward circuit 240 includes coefficient multiplier 249 having the coefficient $h_2^{(2)}$, a unit time delay circuit 250, an adder 251, and a unit time delay circuit 252.

The fourth feed-forward circuit in the second feed-forward circuit 240 incorporates a coefficient multiplier 253 having the coefficient $h_3^{(2)}$, unit time delay circuit 254, an adder 255 and a unit time delay circuit 256.

The fifth feed-forward circuit in the second feed-forward circuit 240 comprises a coefficient multiplier 257 having a coefficient $h_4^{(2)}$, a unit time delay circuit 258, an adder 259, and a unit time delay circuit 260.

The sixth feed-forward circuit in the second feed-forward curcuit 240 contains a coefficient multiplier 261 having a coefficient $h_5^{(2)}$, a unit time delay circuit 262 and another unit time delay circuit 263.

In the second feed-forward circuit 240, the adder 243 is supplied with the output from the lower-stage unit time delay circuit 248; the adder 247 is supplied with the output from the lower-stage unit time delay circuit 252; the adder 251 is provided with the output from the lower-stage unit time delay circuit 256; the adder 255 is furnished with the output from the lower-stage unit time delay circuit 260; and the adder 259 is fed with the output from the lower-stage unit time delay circuit 263. These lower-stage unit time delay circuits are used to provide the timings of their respective upper-stage adders.

The second feedback loop circuit 270 has an adder 271 and a unit time delay circuit 272. The adder 271 functions as a subtracter that subtracts the delayed output of a unit time delay circuit 276 (to be described later) from the result of the operation by the second feed-forward circuit 240. The unit time delay circuit 272 latches and delays the result of the subtraction by the adder 271.

Furthermore, the second feedback loop circuit 270 includes three feedback loop circuits arranged in parallel and connected in cascade fashion. Each of these feedback loop circuits will be described below.

The first feedback loop circuit in the second feedback loop circuit 270 includes a coefficient multiplier 273 that multiplies the delayed output from the unit time delay circuit 272 by a coefficient $g_3^{(2)}$; a unit time delay circuit 274 that latches and delays the result of the multiplication by the coefficient multiplier 273; an adder 275 that adds the delayed output from the unit time delay circuit 274 and the delayed output from a unit time delay circuit 280 (to be described later); and a unit time delay circuit 276 that latches and delays the result of the addition by the adder 275.

The second feedback loop circuit in the second feedback loop circuit 270 incorporates a unit time delay circuit 277 that multiplies the delayed output from the unit time delay circuit 272 by a coefficient $g_4^{(2)}$; a unit time delay circuit 278 that latches and delays the result of the multiplication by coefficient multiplier 277; an adder 279 that adds the delayed output from the unit time delay circuit 278 and the delayed output from a unit time delay circuit 283 (to be described later); and the unit time delay circuit 280 that latches and delays the result of the addition by the adder 279.

The third feedback loop circuit in the second feedback loop circuit 270 includes a coefficient multiplier 281 that multiplies the delayed output from the unit time delay circuit 272 by a coefficient $g_5^{(2)}$; a unit time delay circuit 282 that latches and delays the result of the multiplication by the coefficient multiplier 281; and a unit time delay circuit 283 that latches and delays for another unit time the delayed output from the unit time delay circuit 282.

In the second feedback loop circuit 270, the adder 271 is fed with the output from the lower-stage unit time delay circuit 276 as a subtraction signal; the adder 275 is supplied with the output from the lower-stage unit time delay circuit 280 as an addition signal; and the adder 279 is provided with the output From the lower-stage unit time delay circuit 283 as an addition signal. These lower-stage unit time delay circuits are used to provide the timings of their respective upper-stage adders.

The coefficients of the coefficient multipliers contained in this cascade cyclic digital filter are listed in Table 2 below.

TABLE 2

$$h_0^{(1)} = 1$$
$$h_1^{(1)} = a_{11}^{(1)} - b_{11}^{(1)}$$
$$h_2^{(1)} = -a_{11}^{(1)} \cdot b_{11}^{(1)}$$
$$g_2^{(1)} = -[b_{11}^{(1)}]^2$$
$$h_0^{(2)} = 1$$
$$h_1^{(2)} = a_{11}^{(2)} = b_{11}^{(2)}$$
$$h_2^{(2)} = (a_{21}^{(2)} - a_{11}^{(2)} \cdot b_{11}^{(2)}) - [b_{21}^{(2)} - (b_{11}^{(2)})^2]$$
$$h_3^{(2)} = -a_{21}^{(2)} \cdot b_{11}^{(2)} - (a_{11}^{(2)} - b_{11}^{(2)}) \cdot [b_{21}^{(2)} - (b_{11}^{(2)})^2]$$
$$h_4^{(2)} = -(a_{21}^{(2)} - a_{11}^{(2)} \cdot b_{11}^{(2)}) \times [b_{21}^{(2)} - (b_{11}^{(2)})^2]$$
$$h_5^{(2)} = a_{21}^{(2)} \cdot b_{11}^{(2)} \cdot [b_{21}^{(2)} - (b_{11}^{(2)})^2]$$
$$g_3^{(2)} = -b_{11}^{(2)} \cdot b_{21}^{(2)}$$
$$g_4^{(2)} = -[b_{21}^{(2)} - (b_{11}^{(2)})^2]^2$$
$$g_5^{(2)} = b_{11}^{(2)} \cdot b_{21}^{(2)} \cdot [b_{21}^{(2)} - (b_{11}^{(2)})^2]$$

As described and according to the invention, a second unit time delay circuit is additionally interposed between coefficient multiplier and an adder in a feedback loop circuit without causing substantial changes in the characteristics of the cyclic digital filter. Because the added unit time delay circuit provides additional operation time, high-speed cyclic; (recursive) digital filtering is carried out with no increase in the maximum operation frequency involved. Thus the inventive cyclic digital filter may illustratively be used as an emphasis circuit for high-speed digital filtering in a high definition VTR (video tape recorder).

Where preferred embodiments of the invention have been described using specified terms, such description is for illustrative purposes only, and it is to be understood that changes and variations may be made without departing from the spirit or scope of the following claims.

What is claimed is:

1. A cyclic digital filter, comprising:
a plurality of feedback loops connected in parallel, each of said plurality of feedback loops including:
an adder for receiving a respective input signal and subtracting a respective delayed feedback signal from said respective input signal to form a respective subtraction results;
a first unit time delay circuit connected to said adder for delaying said subtraction result and for outputting said delayed subtraction result as a respective output signal of the feedback loop;
a coefficient multiplier connected to said first time delay circuit for multiplying said delayed subtraction result by a respective predetermined coefficient to form a respective feedback signal;
a second unit time delay circuit for delaying said respective feedback signal formed by said coefficient multiplier to provide said respective delayed feedback signal to said adder; and
means for adding the respective output signals of said plurality of feedback loops.

2. A cyclic digital filter that includes a feedback loop comprising:
a first adder for receiving an input signal and subtracting a feedback signal from said input signal to form an output signal of said cyclic digital filter;
a first unit time delay circuit connected to said first adder for delaying said output signal and providing a delayed output signal; and
a plurality of feedback stages connected in parallel and in cascade and each including:
a coefficient multiplier connected to said first unit time delay circuit for multiplying said delayed output signal by a respective predetermined coefficient to form a respective multiplication result;
a stage-first unit time delay circuit for delaying said respective multiplication result and for outputting a respective delayed multiplication result;
a stage adder for adding said respective delayed multiplication result to a respective stage output signal provided by a next-lower feedback stage to form a respective addition result; and
a stage-second unit time delay circuit for delaying said respective addition result and for providing said delayed respective addition result as a respective stage output signal;
wherein said first adder receives as said feedback signal the respective stage output signal provided by an uppermost of said plurality of feedback stages.

3. A cyclic digital filter according to claim 2, further comprising a lowermost feedback stage which includes:
a last coefficient multiplier connected to said first time unit delay circuit for multiplying said delayed output signal by a respective predetermined coefficient to form a respective multiplication result;
a lowest-stage-first unit time delay circuit for delaying said multiplication result formed by said last coefficient multiplier and outputting a respective delayed multiplication result; and
a lowest-stage-second unit time delay circuit for further delaying said delayed multiplication result outputted from said lowest-state-first unit time delay circuit and for providing said further delayed multiplication result as said respective stage output signal provided to the respective stage adder of a lowest stage of said plurality of feedback stages.

4. A cyclic digital filter that includes a feedback loop comprising:
- a first adder for receiving an input signal and subtracting a feedback signal from said input signal to form a subtraction result;
- a first unit time delay circuit connected to said first adder for delaying said subtraction result and for outputting said delayed subtraction result as an output signal of the feedback loop; and
- a plurality of feedback stages connected in parallel and in cascade and each including:
- a coefficient multiplier connected to said first unit time delay circuit for multiplying said output signal by a respective predetermined coefficient to form a respective multiplication result;
- a stage-first unit time delay circuit for delaying said respective multiplication result and for outputting a respective delayed multiplication result;
- a stage adder for adding said respective delayed multiplication result to a respective stage output signal provided by a next-lower feedback stage to form a respective addition result; and
- a stage-second unit time delay circuit for delaying said respective addition result and for providing said delayed respective addition result as a respective stage output signal;

wherein said first adder receives as said feedback signal the respective stage output signal provided by an uppermost of said plurality of feedback stages.

5. A cyclic digital filter according to claim 1, further comprising a lowermost feedback stage which includes:
- a last coefficient multiplier connected to said first time unit delay circuit for multiplying said output signal by a respective predetermined coefficient to form a respective multiplication result;
- a lowest-stage-first unit time delay circuit for delaying said multiplication result formed by said last coefficient multiplier and outputting a respective delayed multiplication result; and
- a lowest-stage-second unit time delay circuit for further delaying said delayed multiplication result outputted from said lowest-state-first unit time delay circuit and for providing said further delayed multiplication result as said respective stage output signal provided to the respective stage adder of a lowest stage of said plurality of feedback stages.

* * * * *